United States Patent
Manceau et al.

(10) Patent No.: US 9,882,155 B2
(45) Date of Patent: Jan. 30, 2018

(54) ORGANIC ELECTRONIC DEVICES

(71) Applicant: Commissariat A L'Energie Atomique Et Aux Energies Alternatives, Paris (FR)

(72) Inventors: Matthieu Manceau, Annecy (FR); Solenn Berson, Chambéry (FR)

(73) Assignee: Commissariat A L'Energie Atomique Et Aux Energies Alternatives, Paris (FR)

(*) Notice: Subject to any disclaimer, the term of this patent is extended or adjusted under 35 U.S.C. 154(b) by 0 days.

(21) Appl. No.: 15/039,486

(22) PCT Filed: Nov. 25, 2014

(86) PCT No.: PCT/IB2014/066317
§ 371 (c)(1),
(2) Date: May 26, 2016

(87) PCT Pub. No.: WO2015/079380
PCT Pub. Date: Jun. 4, 2015

(65) Prior Publication Data
US 2016/0365526 A1 Dec. 15, 2016

(30) Foreign Application Priority Data
Nov. 26, 2013 (FR) .................. 13 61618

(51) Int. Cl.
*H01L 51/52* (2006.01)
*H01L 51/42* (2006.01)
(Continued)

(52) U.S. Cl.
CPC ...... *H01L 51/4293* (2013.01); *H01L 51/4273* (2013.01); *H01L 51/441* (2013.01);
(Continued)

(58) Field of Classification Search
None
See application file for complete search history.

(56) References Cited

U.S. PATENT DOCUMENTS 8,569,743 B2 * 10/2013 Birnstock ........... H01L 51/0051
257/40
8,765,968 B2 * 7/2014 Chen ..................... B82Y 10/00
136/263
(Continued)

FOREIGN PATENT DOCUMENTS

WO    2005096403       10/2005
WO    2012154045 A1    11/2012

OTHER PUBLICATIONS

International Search Report for PCT/IB2014/066317 dated Apr. 7, 2015.
(Continued)

Primary Examiner — Michael Lebentritt
(74) Attorney, Agent, or Firm — Cooper Legal Group LLC

(57) ABSTRACT

An organic electronic device having an architecture with an inverted structure, containing a substrate, a first electrode deposited on the substrate, a second electrode and at least one assembly including a multilayer stack disposed between the electrodes, the multilayer stack including the following, successively from the first electrode: an N-type layer; an electrically active layer; and a P-type layer comprising a mixture of poly(3,4-ethylenedioxythiophene):poly (styrenesulfonate), the stack containing an additional layer, known as the adhesion layer, formed by at least one metallic oxide and inserted between, and in contact with, the active layer and the P-layer. Also, a method for producing such a device.

15 Claims, 2 Drawing Sheets

(51) Int. Cl.
H01L 51/44 (2006.01)
H01L 51/50 (2006.01)

(52) U.S. Cl.
CPC ........ H01L 51/448 (2013.01); H01L 51/5012 (2013.01); H01L 51/5203 (2013.01); H01L 51/5243 (2013.01); H01L 51/5068 (2013.01); H01L 2251/5369 (2013.01); Y02E 10/549 (2013.01)

(56) References Cited

U.S. PATENT DOCUMENTS

| | | | | |
|---|---|---|---|---|
| 9,496,506 | B2* | 11/2016 | Lecloux | C07D 487/04 |
| 2011/0240996 | A1* | 10/2011 | Lin | H01L 51/5048 257/43 |
| 2015/0075622 | A1* | 3/2015 | Bazan | H01L 51/0036 136/263 |
| 2015/0284844 | A1* | 10/2015 | Suzuki | C23C 16/30 428/337 |
| 2016/0272753 | A1* | 9/2016 | Nanson | H01L 51/0003 |

OTHER PUBLICATIONS

Chao Du et al.: "Organic Solar Cells Using Tin (II) Phthalocyanine as Donor Material", Energy Procedia, vol. 12, Dec. 15, 2011, pp. 519-524. p. 520, line 4-line 6; figure 3.

Zhao Yongbiao et al.: "Poly(3,4-ethylenedioxythiophenje): poly (styrenesulfonate)/MoOcomposite layer for efficient and stable hole injection in organic semiconductors", Journal of Applied Physics, American Institute of Physics, 2 Huntington Quadrangle, Melville, NY 11747, vol. 111, No. 4, Feb. 15, 2012, pp. 43716-43716-5. p. 111, col. 1, line 1-line 6; p. 112, col. 1, line 18-col. 2, line 7; p. 112, col. 2, line 13-line 15.

W. J. E. Beek et al.: "Hybrid Zinc Oxide Conjgated Polymer Bulk Heterojunction Solar Cells" Journal of Physical Chemistry. B, Materials, Surfgaces, Interfaces and Biophysical, Washington, DC, US, vol. 109, No. 19, May 19, 2005, pp. 9505-9516. p. 9505, col. 2, line 31-p. 9506, col. 2, line 3.

Thue T. Larson-Olsen et al.: "A Solution process for inverted tendem solar cells", Organic Electronics, Elsevier, Amsterdam NL, vol. 12, No. 2, Nov. 21, 2010, pp. 364-37. figure 3.

Matthew T. Loyd et al.: "Influence of the hole-transport layer on the initial behavior and lifetime of inverted ortganic photovoltaics", Solar Energy Materials & Solar Cells, Elsevier, Amsterdam NL, vol. 95, 2011, pp. 1382-1388.

Gérard Perrier et al.: "Impedance spectrometry of optimized standrd and inverted P3HT-PCBM organic solar cells", Solar Energy Materials & Solar Cells, Elsevier, Amsterdam NL, vol. 101, Jun. 2012, pp. 210-216.

Stephanie R. Dupont et al.: "Interlayer adhesion in roll-to-roll processed flexible inverted polymer solar cells", Solar Energy Materials & Solar Cells, Elsevier, Amsterdam, NL, vol. 97, 2012, pp. 171-175.

* cited by examiner

ORGANIC ELECTRONIC DEVICES

The present invention relates to the field of organic electronic devices such as organic solar or photovoltaic cells (OPVs), organic light-emitting diodes (LEDs), and organic photodetectors (OPDs).

These devices consist of first and second electrodes respectively placed above and below a multilayer stack especially comprising what is called an "active" layer adjoining what is called a "p-type" layer.

More precisely, the invention aims to improve the adhesion between this active layer and this p-type layer.

A p-type material is a material in which the number of holes greatly exceeds the number of electrons. A p-type material therefore preferentially conducts holes.

An n-type material is a material in which the number of electrons greatly exceeds the number of holes. An n-type material therefore preferentially conducts electrons.

In the active layer of OPV cells, after absorption of a photon, a hole and an electron are created. Since each charge must be collected specifically at one electrode, interface layers are added allowing holes or electrons to be selected.

A p-type interface layer is therefore a layer allowing the holes generated in the active layer to be selectively extracted and these holes to be subsequently transported to the anode.

An n-type interface layer is therefore a layer allowing the electrons generated in the active layer to be selectively extracted and these electrons to be subsequently transported to the cathode.

Organic electronic devices, and in particular organic solar cells, may be classified as having a standard or inverted structure depending on the order of succession of their constituent layers.

In what is called a standard structure, these layers are deposited in the following order:
  substrate;
  transparent conductive layer by way of first electrode and forming the anode;
  p-type semiconductor layer referred to as the "hole transport layer" or p-type layer;
  electrically active layer referred to as the "active layer";
  n-type semiconductor layer referred to as the "electron transport layer" and n-type layer; and
  conductive layer by way of second electrode and forming the cathode.

In what is called an inverted or even NIP structure, the stack is inverted and the layers are deposited in the following sequence:
  a substrate 1;
  a transparent conductive layer by way of first electrode 2 and forming the cathode;
  an n-type semiconductor layer 3 referred to as the "electron transport layer" or n-type layer;
  an electrically active layer 4 referred to as the "active layer";
  a p-type semiconductor layer 5 referred to as the p-type layer or even the "hole transport layer"; and
  a conductive layer by way of second electrode 6 or upper electrode forming the anode.

This second structure, illustrated in FIG. 1, is that which allows, at the present time, the longest lifetime to be achieved for this type of device.

Generally, the p-type semiconductor layers used in these structures are formed for the most part from a blend of two polymers, poly(3,4-ethylenedioxythiophene) (PEDOT) and sodium polystyrene sulfonate (PSS), i.e. the polymer blend referred to as PEDOT:PSS. Thus, these layers have the property of being hydrophilic.

Moreover, the electrically active layers conventionally used in these structures consist of a blend containing at least two semiconductors: an n-type semiconductor (electron acceptor) and a hole-transporting p-type semiconductor (electron donor). These active layers are therefore generally hydrophobic.

There is therefore naturally an incompatibility between these two types of layer (p-type layer and active layer), which must nevertheless be superposed one on the other in order to guarantee good device operation.

This affinity defect moreover has the consequence of making it difficult to produce a stack thereof. More particularly, one of the difficulties in the production of stacks of inverted structure using a p-type interface layer made of PEDOT:PSS resides in the difficulties encountered when implementing a wet deposition process with two layers that have a low affinity: a PEDOT:PSS layer, i.e. a hydrophilic material generally dispersed in water (ink with a high surface tension), and a hydrophobic active layer with a low surface energy.

Furthermore, once these layers have been deposited on one another, the adhesion between said active and p-type layers remains weak, and hence they naturally have a tendency to debond. This low adhesion makes it less easy to manipulate cells containing this type of stack during their encapsulation, and also during their use, in particular during use in flexible or shapeable modules.

A plurality of solutions to the problem of incompatibility between the active layer and the p-layer have already been envisioned.

One solution proposed in the case of inverted structures suggests using ozone and ultraviolet to treat the surface of the active layer in order to make it hydrophilic. However, this type of treatment affects the integrity of the active layer and therefore decreases the efficiency of the final device (Lloyd et al. *Solar Energy Materials and Solar Cells,* 95, 2011, 1382-1388).

Another solution consists in dipping the stack into a solution (dip coating process). However, this process on the one hand runs the risk of degrading the stack and on the other hand does not allow the thickness of the p-type layer deposited on the active layer to be controlled. This solution may also decrease the electrical performance of the module.

Therefore, there remains a need for a solution allowing the adhesion between the p-type layer and the active layer to be improved and preservation of this satisfactory adhesion level to be guaranteed during use of the corresponding cells.

One objective of the present invention is precisely to meet this need.

Thus, the invention provides an effective way of obtaining adhesion between an active layer and a p-layer, the adhesion obtained furthermore having improved properties in terms of stability, performance and lifetime.

Another objective of the invention is to provide a process for preparing an organic electronic device, in which a stack of a p-layer and an active layer is easily obtained.

The main subject of the present invention is an organic electronic device having an inverted structure architecture, containing a substrate, a first electrode deposited on the substrate, a second electrode and at least one assembly comprising a multilayer stack placed between said electrodes, said multilayer stack comprising in succession from the first electrode:
  an n-type layer;
  an electrically active layer; and a p-type layer based on a poly(3,4-ethylenedioxythiophene):polystyrene sulfonate (PEDOT:PSS) mixture;

wherein said stack contains an additional layer that is what is referred to as a "tie layer" composed of at least one metal oxide and that is intermediate between and in contact with the active layer and the p-type layer.

In said device, the layers forming the stack are placed in the following order of superposition from the first electrode: the n-type layer, the electrically active layer, the tie layer composed of at least one metal oxide and the p-type layer based on a poly(3,4-ethylenedioxythiophene):polystyrene sulfonate mixture.

Another subject of the invention is a process for preparing a multilayer stack, having an inverted structure architecture, in particular a constituent stack of an OPV cell, comprising an electrically active layer superposed on an n-type layer, said process comprising forming a layer that is what is referred to as a "tie layer" intermediate between and in contact with the layer referred to as the active layer and the p-type layer, said "tie layer" being formed from at least one metal oxide, preferably a metal oxide in nanoparticle state.

More precisely, yet another subject of the present invention is a process for preparing an organic electronic device of inverted structure comprising at least the following steps:

(i) providing a substrate coated on one of its sides with a multilayer stack comprising in order of superposition from said substrate: a conductive layer by way of first electrode and an n-type layer;

(ii) forming an electrically active layer on the n-type layer;

(iii) bringing said active layer into contact with a medium containing particles, and preferably nanoparticles, of at least one metal oxide, and exposing the assembly to conditions propitious to the formation of what is referred to as a tie layer;

(iv) forming, by wet processing, in contact with the tie layer, a p-type layer composed of a blend of two polymers, poly(3,4-ethylenedioxythiophene) (PEDOT) and sodium polystyrene sulfonate (PSS), i.e. the polymer blend referred to as PEDOT:PSS; and (v) depositing in contact with the p-type layer a conductive layer by way of second electrode.

According to another of these subjects, the present invention relates to a process for improving the adhesion between an electrically active layer and a p-type layer in an organic electronic device, said process consisting in forming a layer composed of at least one metal oxide at the intersection of the two layers.

As will become clear from the following, the presence of the layer referred to as the tie layer in contact with and intermediate between the layers referred to as the "active" and "p-type" layers is advantageous in a number of respects.

Firstly, it significantly improves the level of adhesion between these two layers, and the assembly exhibits an increased mechanical strength in comparison to a stack devoid of this tie layer.

This layer proves to be easy to produce and satisfactory in terms of quality.

Specifically, this tie layer may be formed from a simple deposit of a dispersion of metal oxide nanoparticles on the surface of the active layer of OPV devices. It is not necessary to carry out a surface treatment beforehand.

Lastly, this tie layer proves to be propitious to the formation of a uniform and homogeneous p-layer deposition in contact therewith.

Other advantages and features will become apparent on reading the description, figures and examples that follow.

DESCRIPTION OF THE FIGURES

FIG. 1: Organic photovoltaic cell with what is called an "inverted" (NIP) structure.

Figure 4:
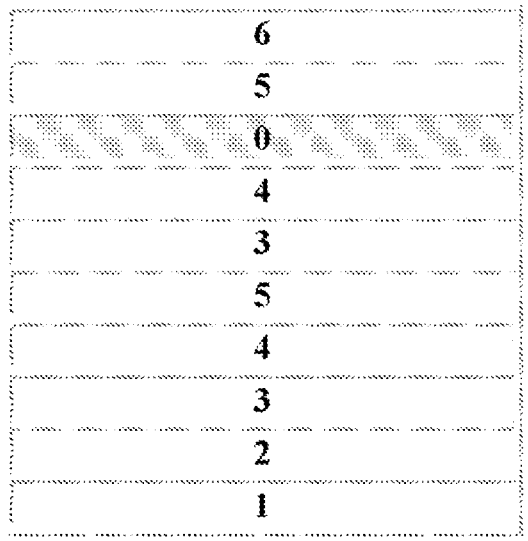

This cell comprises from bottom to top the following layers: a substrate 1; a first electrode 2 (cathode); an n-type semiconductor layer 3; an electrically active layer 4; a p-type semiconductor layer 5; and a second electrode 6 (anode) or upper electrode.

Figures 1, 2, 3:
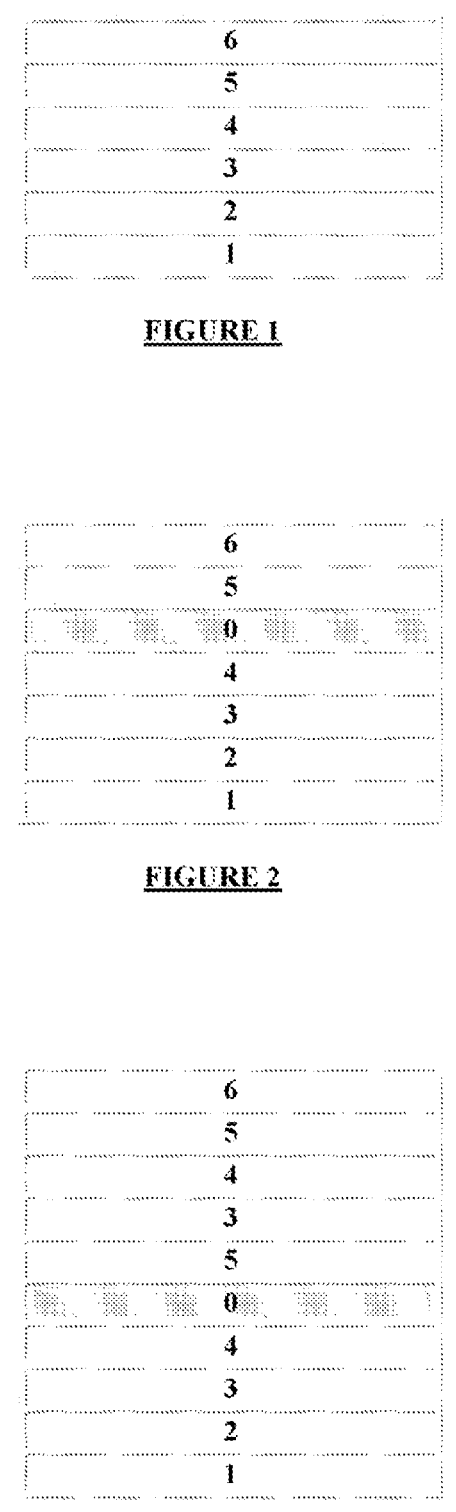

FIG. 2: Organic photovoltaic cell with what is called an "inverted" (NIP) structure incorporating a tie layer.

This cell comprises from bottom to top the following layers: a substrate 1; a first electrode 2 (cathode); an n-type semiconductor layer 3; an active layer 4; a tie layer 0; a p-type semiconductor layer 5; and a second electrode 6 (anode) or upper electrode.

Figure 5:
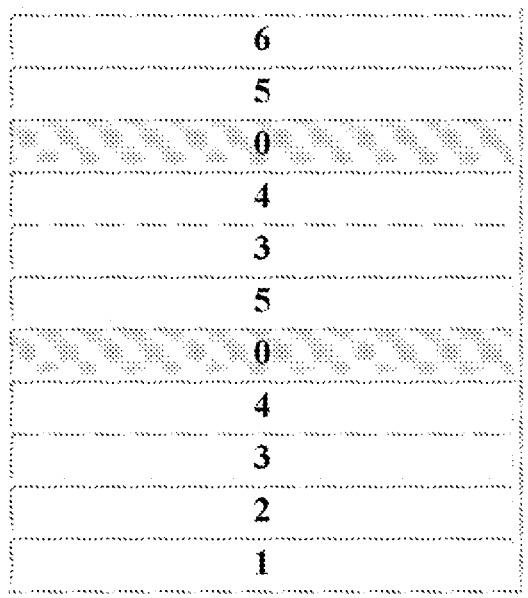

FIGS. 3 to 5 show a plurality of types of NIP devices in "tandem" mode, i.e. comprising a plurality of stacks and incorporating at least one tie layer.

FIG. 3: This cell comprises from bottom to top the following layers: a substrate 1; a first electrode 2 (cathode); an n-type semiconductor layer 3; an active layer 4; a tie layer 0; a p-type semiconductor layer 5; an n-type semiconductor layer 3; an active layer 4; a p-type semiconductor layer 5; and a second electrode 6 (anode) or upper electrode.

FIG. 4: This cell comprises from bottom to top the following layers: a substrate 1; a first electrode 2 (cathode); an n-type semiconductor layer 3; an active layer 4; a p-type semiconductor layer 5; an n-type semiconductor layer 3; an active layer 4; a tie layer 0; a p-type semiconductor layer 5; and a second electrode 6 (anode) or upper electrode.

FIG. 5: This cell comprises from bottom to top the following layers: a substrate 1; a first electrode 2 (cathode); an n-type semiconductor layer 3; an active layer 4; a tie layer 0; a p-type semiconductor layer 5; an n-type semiconductor layer 3; an active layer 4; a tie layer 0; a p-type semiconductor layer 5; and a second electrode 6 (anode) or upper electrode.

DETAILED DESCRIPTION

Tie Layer

As will be clear from the above, the device in question according to the invention is characterized by the presence of a tie layer, in the multilayer stack of inverted structure featuring between its first and second electrodes.

This tie layer, considered in a device according to the invention, makes contact with and is intermediate between the active layer and the p-type layer.

The device has an inverted structure architecture and, more particularly, it is a question of an organic photovoltaic cell with an inverted structure.

Thus, the tie layer is formed in contact with the active layer, then the p-type layer is formed in contact with this tie layer.

The tie layer implemented according to the present invention is a layer of metal oxide(s) in nanoparticle form.

The nanoparticles are in particular particles having a maximum size smaller than or equal to 200 nm.

In the rest of the text, the expression "particle size" is used to characterize this maximum size.

The metal oxide may be a p-type semiconductor metal oxide. In this case, the particles have a size comprised between 2 nm and 200 nm.

The metal oxide may also be an n-type semiconductor metal oxide or an inert metal oxide. The size of the particles is then comprised between 2 and 10 nm.

The thickness of this tie layer may more particularly be adjusted, with regard to the chemical nature of the constituent particles, and in particular nanoparticles, of metal oxide thereof. Furthermore, the metal oxide particle sizes given above also correspond to the thickness of the dry layer formed with said particles.

Thus, according to a first variant, the tie layer comprises at least one metal oxide chosen from the following metal oxides: $V_2O_5$, NiO, $WO_3$, $MoO_3$ and mixtures thereof, and possesses a thickness ranging from 2 nm to 200 nm.

In particular, when the tie layer comprises $MoO_3$, or even consists of $MoO_3$, it possesses a thickness ranging from 20 nm to 200 nm.

These metal oxides may also be used in hydrated form.

According to a second variant, the tie layer comprises at least one metal oxide chosen from the following metal oxides: $T_iO_x$ in which x is lower than or equal to 2, ZnO and mixtures thereof, and has a thickness ranging from 2 nm to 10 nm.

According to a third variant, the tie layer comprises at least one metal oxide chosen from the following metal oxides: $Al_2O_3$, $SiO_2$ and mixtures thereof. In this case, the layer has a thickness ranging from 2 nm to 10 nm.

This tie layer made of metal oxide(s) may, advantageously, be formed on the surface of the electrical active layer from a liquid mixture comprising the particles, in particular the nanoparticles, of metal oxides.

As detailed below, these metal oxides may be deposited as such, but may also be generated in contact with the layer referred to as the active layer, from a precursor material undergoing for example sol-gel type reaction.

Thus, a solution of $Zn(OAc)_2$, $2H_2O$ may be used by way of ZnO oxide precursor, and likewise a solution of vanadyl triisopropoxide (VTIP) in isopropanol may be used by way of $V_2O_5$ oxide precursor.

The metal oxide precursor is generally converted into metal oxide by low-temperature hydrolysis in the presence of one or more appropriate solvents. Tuning of the experimental conditions is within the ability of those skilled in the art.

Preferably, the particles, in particular the nanoparticles, of metal oxide are implemented in the form of a dispersion in a solvent, especially an alcoholic solvent, generally without surfactant. Preferably, said alcoholic solvent is a primary alcohol, preferably a $C_2$-$C_4$ mono-alcohol and in particular ethanol, n-propanol, isopropanol, n-butanol, 2-butanol, methyl propanol and mixtures of these solvents.

Apart from the primary alcohol, the dispersion may also comprise a diol, in particular ethane-diol or propanediol.

This liquid mixture containing the particles, and in particular the nanoparticles, of metal oxide(s) or the precursor material of the metal oxide(s), may be deposited by any type of known wet or solvent process. More particularly, this process may be chosen from a tape casting process, a doctor blading process for example, a spin coating process, a slot die coating process, an inkjet printing process, a rotogravure process and a screen printing process.

The particles of metal oxide(s) may also be deposited by evaporation.

This liquid mixture is advantageously deposited at a temperature below 100° C. and for example comprised between room temperature and 100° C. The tie layer is then formed by exposing the assembly to various post-treatments such as a bake, especially at a temperature comprised between 80° C. and 130° C., and for example for a time ranging from 5 minutes to 30 minutes.

It is within the ability of those skilled in the art to implement a particular post-treatment adapted in particular to the type of metal oxide used and to the thickness desired for the tie layer.

Generally, when a precursor of metal oxide(s) is used to prepare the tie layer based on metal oxide(s), a subsequent baking step is preferably carried out.

Electrically Active Layer

The electrically active layer of organic electronic devices generally consists of a blend containing at least two semiconductors: an n-type semiconductor (electron acceptor) and a p-type semiconductor (electron donor).

The p-type semiconductor contained in the active layer may be chosen from polymers containing thiophene units, polymers containing thienothiophene units, polymers containing diketopyrrolopyrrole units, polymers containing benzothiadiazole units, polymers containing thienopyrroledione units, polymers containing bithiophene dicarboximide units and polymers containing carbazole units.

For example, the p-type semiconductor polymer is chosen from the following polymers: (poly(3-hexylthiophene) or P3HT, poly[N-9'-heptadecanyl-2,7-carbazole-alt-5,5-(4,7-di-2-thienyl-2',1',3'-benzothiadiazole or PCDTBT, poly[2,1,3-benzothiadiazole-4,7-diyl[4,4-bis(2-ethylhexyl)-4H-cyclopenta[2,1-b:3,4-b']dithiophene-2,6-diyl]] or PCPDTBT, PBDTTPD, and poly[[4,8-bis[(2-ethylhexyl)oxy] benzo[1,2-b:4,5-b']dithiophene-2,6-diyl][3-fluoro-2-[(2-ethylhexyl)carbonyl]thieno[3,4-b]thiophenediyl]] or PTB7.

The p-type semiconductor contained in the active layer may be chosen from p-type semiconductor molecules such as:

porphyrin;
7,7'-(4,4-bis(2-ethylhexyl)-4H-silolo[3,2-b:4,5-b2]dithiophene-2,6-diyl)bis(6-fluoro-4-(5'-hexyl-[2,2'-bithiophene]-5-yl)benzo[c][1,2,5]thiadiazoles):
p-DTS(FBTTh2)2;
boron-dipyrromethenes (BODIPYs); and
molecules with triphenylamine (TPA) as a core.

The carbon-containing n-type semiconductor contained in the active layer is advantageously chosen from materials containing:

perylene units;
fullerene units, for example fullerene $C_{60}$, fullerene $C_{70}$, fullerene $C_{80}$ or fullerene $C_{84}$;
semiconductor carbon nanotubes;
graphene and nanographenes;
and their soluble derivatives, such as [6,6]-phenyl-$C_{61}$-methyl butyrate also known by the name PCBM or $PC_{61}BM$, [6,6]-phenyl-$C_{71}$-methyl butyrate or $PC_{71}BM$, a thiophene-$C_{61}$-methyl butyrate, a multiadduct of a $C_{60}$ or $C_{70}$ fullerene or functionalized carbon nanotubes; and
n-type polymers.

Preferably, the n-type semiconductor is chosen from materials containing fullerene units, especially $C_{60}$, $C_{70}$, $C_{80}$ and $C_{84}$, and materials containing perylene units, in particular the following materials: $PC_{60}BM$ and $PC_{70}BM$.

The process used to deposit the active layer is generally a wet process.

The active layer may be formed by various methods for depositing a liquid mixture comprising p-type and n-type semiconductors, respectively, such as a spin coating or any other coating process or a printing method such as an inkjet, screen printing, slot-die coating, flexographic or rotogravure technique.

The active layer may also be formed by evaporation.

Furthermore, a heat treatment or baking step may also be carried out at a temperature ranging from 50° C. to 180° C. for a time ranging from 1 to 30 minutes.

P-Type Layer

As mentioned above, the present invention aims to improve the adhesion between the active layer and the p-type layer.

The p-type layer is a p-type semiconductor layer that is what is referred to as a "hole transport layer".

According to the present invention, the p-layer is a layer of poly(3,4-ethylenedioxythiophene):polystyrene sulfonate (PEDOT:PSS). PEDOT:PSS is implemented in a conventional solvent such as water, the alcohols, in particular the primary alcohols, the diols, especially ethane-diol and propanediol, the glycol ethers and the mixture(s) thereof. This layer is dried at low temperature, generally between room temperature and 140° C. It is within the ability of those skilled in the art to deposit this layer.

It is within the ability of those skilled in the art to choose the nature of the p-layer and of the electrodes depending on the desired results.

Electrodes

The electrodes are generally made of metal or of metal oxides or carbon. More particularly, in a device with an inverted structure, the cathode is a transparent conductive metal oxide and the anode is a metal.

By way of metals, mention may be made of silver, copper, titanium and aluminum.

By way of metal oxides (TCOs), mention may be made of the compounds ITO (indium-tin oxide), AZO (aluminum-zinc oxide), IZO (indium-zinc oxide) or FTO (F-doped tin oxide). Mention may also be made of multilayer stacks of the TCO/metal/TCO type.

In devices according to the invention the cathode is for example formed of an electrically conductive oxide and the anode is made of silver.

N-Type Layer

In the context of the present invention, the n-type layer comprises at least one metal oxide chosen from $TiO_x$ in which x is lower than or equal to 2, ZnO and mixtures thereof.

This layer is prepared and deposited in the same way as the n-type tie layer.

The organic electronic device according to the invention may be an organic photovoltaic (or solar) (NIP) cell, an organic light-emitting diode or an organic photodetector; furthermore, it may also be a question of a "tandem" organic electronic device.

According to a first variant, the "tandem" organic electronic device according to the invention comprises first and second electrodes and an assembly comprising a multilayer stack containing a tie layer such as defined according to the invention, said assembly being placed between said electrodes.

According to another variant, the "tandem" organic electronic device according to the invention comprises first and second electrodes and two assemblies each comprising a multilayer stack containing a tie layer such as defined according to the invention, said assemblies being placed between said electrodes.

By way of example, mention is made of the devices according to the invention formed from the following layers deposited on a substrate such as PET and in which the upper electrode is preferably made of metal:

TCO/n-layer/active layer/tie layer/p-layer/n-layer/active layer/p-layer/electrode;

TCO/n-layer/active layer/p-layer/n-layer/active layer/tie layer/p-layer/electrode;

TCO/n-layer/active layer/tie layer/p-layer/n-layer/active layer/tie layer/p-layer/electrode.

These devices are shown in FIGS. 3 to 5, respectively.

EXAMPLES

Example 1

Preparation of a Stack for an OPV Device Incorporating a Tie Layer According to the Invention Two types of tie layer are considered here, one based on tungsten oxide (p-type oxide), and the other based on $TiO_x$ (n-type oxide).

The dispersion of $WO_3$ (2.5% by weight, without surfactant, 2-propanol base, 10-20 nm particle size, triclinic crystal structure) is that from Nanograde Llc.

The dispersion of nanoparticles of titanium oxide $TiO_x$ used is a dispersion in ethanol.

The structure of the stack in question is the following:

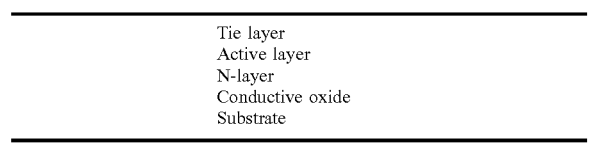

The substrate is a substrate made of PET covered with a transparent conductive oxide with a sheet resistance lower than 15 ohm $sq^{-1}$.

The n-layer is a zinc oxide (ZnO);

the active layer is a mixture of poly(3-hexylthiophene) and [6,6]-phenyl-$C_{61}$-methyl butyrate (P3HT/PCBM);

the p-layer is a layer of PEDOT:PSS of commercial formulation Clevios F 010, Heraeus.

The n- and active layers and the tie layer are formed by spin coating on a substrate made of coated PET.

The thickness of the tie layers formed is the following:
$WO_3$~50 nm; and
$TiO_x$~10 nm.

Example 2

Characterization of the Properties of the Stacks of Example 1 a) Affinity Test

The affinity of the tie layer for a formulation representative of a p-type layer is ascertained via a wettability test.

The p-formulation used is a layer of PEDOT:PSS of commercial formulation F010. Droplet angle measurements were carried out under room temperature (~25° C.) and humidity (~35%) conditions.

The influence of each of the two tie layers on the droplet angle of a reference p-formulation is detailed in table 1 below.

TABLE 1

| Tie layer | Droplet angle |
|---|---|
| — | 40° |
| $WO_3$ | <10° |
| $TiO_x$ | 25° |

It will be noted that the p-layer has a good affinity for the (TiO$_x$ or WO$_3$) tie layer. Specifically, a decrease in the droplet angle is observed on the surface of the tie layer compared to the active layer alone.

b) Influence of the Tie Layer on the Adhesion of the p-Layer

The samples are prepared according to the standard CEA INES protocol for producing OPV devices (Perrier et al. Solar Energy Materials and Solar Cells Volume 101, June 2012, Pages 210-216).

The adhesion tests are carried out using a "Post-it" type adhesive: the adhesive is positioned by hand on the surface of the sample, then removed manually.

This influence was ascertained with respect to a p-layer formed in contact with the tie layer of the stacks prepared in example 1.

This p-layer is a layer of PEDOT:PSS of commercial formulation Clevios F 010, Heraeus.

The presence of the tie layer allows the adhesion of the p-layer to be improved. Specifically, it will be noted that without a tie layer, the adhesion of the p-layer to the active layer is very weak. In the presence of a (TiO$_x$ or WO$_3$) tie layer, the p-layer is not affected by the adhesion test and remains almost intact after the adhesion test.

c) Evaluation of the Performance of Devices Incorporating a Stack According to Those of Example 1

The OPV devices considered preceding a multilayer stack as follows:

| |
|---|
| Silver |
| P-layer |
| Tie layer |
| Active layer |
| N-layer |
| Conductive oxide |
| PET substrate |

The n-layer is a layer of zinc oxide (ZnO) and the active layer is based on poly(3-hexylthiophene) and [6,6]-phenyl-C$_{61}$-methyl butyrate, i.e. (P3HT/PCBM).

The p-layer is a PEDOT:PSS layer (commercial formulation Clevios F 010, Heraeus).

The various layers are formed by spin coating except for the silver electrode.

The active area of the devices is 1.6 cm$^2$ and their performance was measured at 25° C. under standard illumination conditions (1000 W/m$^2$, AM 1.5 G) (table 2 below).

The test parameters are:
Voc: open circuit voltage;
Jsc: short-circuit current density;
FF: fill factor; and
PCE: power conversion efficiency.

The test protocols are explained in the document Perrier et al. *Solar Energy Materials and Solar Cells*, Volume 101, June 2012, Pages 210-216.

TABLE 2

Influence of the tie layer on device performance

| Tie layer | Voc (mV) | Jsc (mA/cm$^{-2}$) | FF (%) | PCE (%) |
|---|---|---|---|---|
| — | 560.5 | 7.7 | 41.8 | 1.80 |
| WO$_3$ | 561.3 | 8.0 | 38.7 | 1.75 |
| TiO$_x$ | 559.8 | 7.0 | 41.5 | 1.6 |

The performance of devices incorporating a tie layer is rather similar to the reference value, especially when WO$_3$ is used.

The invention claimed is:

1. An organic electronic device having an inverted structure architecture, containing a substrate, a first electrode deposited on the substrate, a second electrode and at least one assembly comprising a multilayer stack placed between said electrodes, said multilayer stack comprising in succession from the first electrode:
   an n-type layer;
   an electrically active layer; and
   a p-type layer based on a poly(3,4-ethylenedioxythiophene):polystyrene sulfonate mixture;
wherein said stack contains an additional layer that is what is referred to as a "tie layer" composed of at least one metal oxide in nanoparticle form and that is intermediate between and in contact with the active layer and the p-type layer.

2. The device as claimed in claim 1, wherein the tie layer is a layer comprising at least one metal oxide chosen from the following metal oxides:
   V$_2$O$_5$, NiO, MoO$_3$, WO$_3$ and mixtures thereof and possesses a thickness ranging from 2 nm to 200 nm.

3. The device as claimed in claim 1, wherein the tie layer comprises at least one metal oxide chosen from the following metal oxides: T$_i$O$_x$ in which x is lower than or equal to 2, ZnO and mixtures thereof, and has a thickness ranging from 2 nm to 10 nm.

4. The device as claimed in claim 1, wherein the tie layer comprises at least one metal oxide chosen from the following metal oxides: Al$_2$O$_3$, SiO$_2$ and mixtures thereof and has a thickness ranging from 2 nm to 10 nm.

5. The organic electronic device as claimed in claim 1, wherein the active layer is an n-type semiconductor blended with a p-type semiconductor.

6. The organic electronic device as claimed in claim 5, wherein the p-type semiconductor is chosen from polymers containing thiophene units, polymers containing thienothiophene units, polymers containing diketopyrrolopyrrole units, polymers containing benzothiadiazole units, polymers containing thienopyrroledione units, polymers containing bithiophene dicarboximide units and polymers containing carbazole units, and p-type semiconductor molecules chosen from porphyrin, 7,7'-(4,4-bis(2-ethylhexyl)-4H-silolo[3,2-b:4,5-b 2]dithiophene-2,6-diyl)bis(6-fluoro-4-(5'-hexyl-[2,2'-bithiophene]-5-yl)benzo[c][1,2,5]thiadiazoles), borondipyrromethenes and molecules with triphenylamine as a core.

7. The organic electronic device as claimed in claim 5, wherein the n-type semiconductor is chosen from materials containing fullerene units, and materials containing perylene units.

8. The organic electronic device as claimed in claim 7, wherein the n type semiconductor is chosen from materials containing C$_{60}$, C$_{70}$, C$_{80}$ and C$_{84}$ fullerene units.

9. The organic electronic device as claimed in claim 7, wherein the n-type semiconductor is chosen from PC$_{60}$BM and PC$_{70}$BM.

10. The organic electronic device as claimed in claim 1, wherein the n-type layer comprises at least one metal oxide chosen from the following metal oxides: TiO$_x$ in which x is lower than or equal to 2, ZnO and mixtures thereof and has a thickness comprised between 2 nm and 200 nm.

11. The organic electronic device as claimed in claim 1, comprising first and second electrodes and an assembly comprising a multilayer stack containing a tie layer, said assembly being placed between said electrodes.

12. The organic electronic device as claimed in claim 1, comprising first and second electrodes and two assemblies each comprising a multilayer stack containing a tie layer, said assemblies being placed between said electrodes.

13. A process for preparing a multilayer stack, having an inverted structure architecture, comprising an electrically active layer superposed on an n-type layer, wherein said process comprises forming a layer that is what is referred to as a "tie layer" intermediate between and in contact with the layer referred to as the active layer and the p-layer, said "tie layer" being formed from at least one metal oxide in nanoparticle state.

14. A process for preparing an organic electronic device of inverted structure comprising at least the following steps:

(i) providing a substrate coated on one of its sides with a multilayer stack comprising in order of superposition from said substrate: a conductive layer by way of first electrode and an n-type layer;

(ii) forming an electrically active layer on the n-type layer;

(iii) bringing said active layer into contact with a medium containing nanoparticles, of at least one metal oxide, and exposing the assembly to conditions propitious to the formation of what is referred to as a tie layer;

(iv) forming, by wet processing, in contact with the tie layer, a p-type layer based on a blend of two polymers, poly(3,4-ethylenedioxythiophene) (PEDOT) and sodium polystyrene sulfonate (PSS), i.e. the polymer blend referred to as PEDOT:PSS; and (v) depositing in contact with the p-type layer a conductive layer by way of second electrode.

15. A process for improving the adhesion between an electrically active layer and a p-type layer in an organic electronic device, said process consisting in forming a layer composed of at least one metal oxide in nanoparticle form at the intersection of the two layers.

\* \* \* \* \*